United States Patent
Matsuzawa et al.

(10) Patent No.: US 9,825,646 B1
(45) Date of Patent: Nov. 21, 2017

(54) INTEGRATOR AND A/D CONVERTER USING THE SAME

(71) Applicant: TECH IDEA CO., LTD., Kawasaki-shi, Kanagawa (JP)

(72) Inventors: Akira Matsuzawa, Kawasaki (JP); Masaya Nohara, Tsukuba (JP)

(73) Assignee: TECH IDEA CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/640,736

(22) Filed: Jul. 3, 2017

(30) Foreign Application Priority Data

Jul. 7, 2016 (JP) .................................. 2016-135325

(51) Int. Cl.
| | |
|---|---|
| *H03M 1/12* | (2006.01) |
| *H03M 3/00* | (2006.01) |
| *H03F 3/45* | (2006.01) |

(52) U.S. Cl.
CPC .......... *H03M 3/458* (2013.01); *H03F 3/4521* (2013.01); *H03M 3/32* (2013.01)

(58) Field of Classification Search
CPC ........ H03M 3/458; H03M 3/32; H03F 3/4521
USPC ........................................................ 341/155
See application file for complete search history.

(56) References Cited

U.S. PATENT DOCUMENTS

| | | | |
|---|---|---|---|
| 5,495,199 A | 2/1996 | Hirano | |
| 7,038,532 B1 * | 5/2006 | Bocko | G06G 7/186 327/337 |
| 8,614,639 B1 * | 12/2013 | Yin | H03M 1/56 341/144 |
| 9,218,514 B2 * | 12/2015 | Kim | H03M 3/496 |
| 9,558,845 B2 * | 1/2017 | Huang | G11C 27/026 |

FOREIGN PATENT DOCUMENTS

JP          5-37300 A     2/1993

* cited by examiner

*Primary Examiner* — Brian Young
(74) *Attorney, Agent, or Firm* — Hauptman Ham, LLP

(57) ABSTRACT

An integrator includes a first switch, a first capacitor, a second switch, a second capacitor, an amplifier, a third switch, a forth switch, a third capacitor, and a control circuit. The control circuit repeats a first phase and a second phase. In the first phase, the control circuit renders the first switch and the third switch to turn on and the second switch and the fourth switch to turn off. In the second phase, the control circuit renders the second switch and the fourth switch to turn on and the first switch and the third switch to turn off.

18 Claims, 11 Drawing Sheets

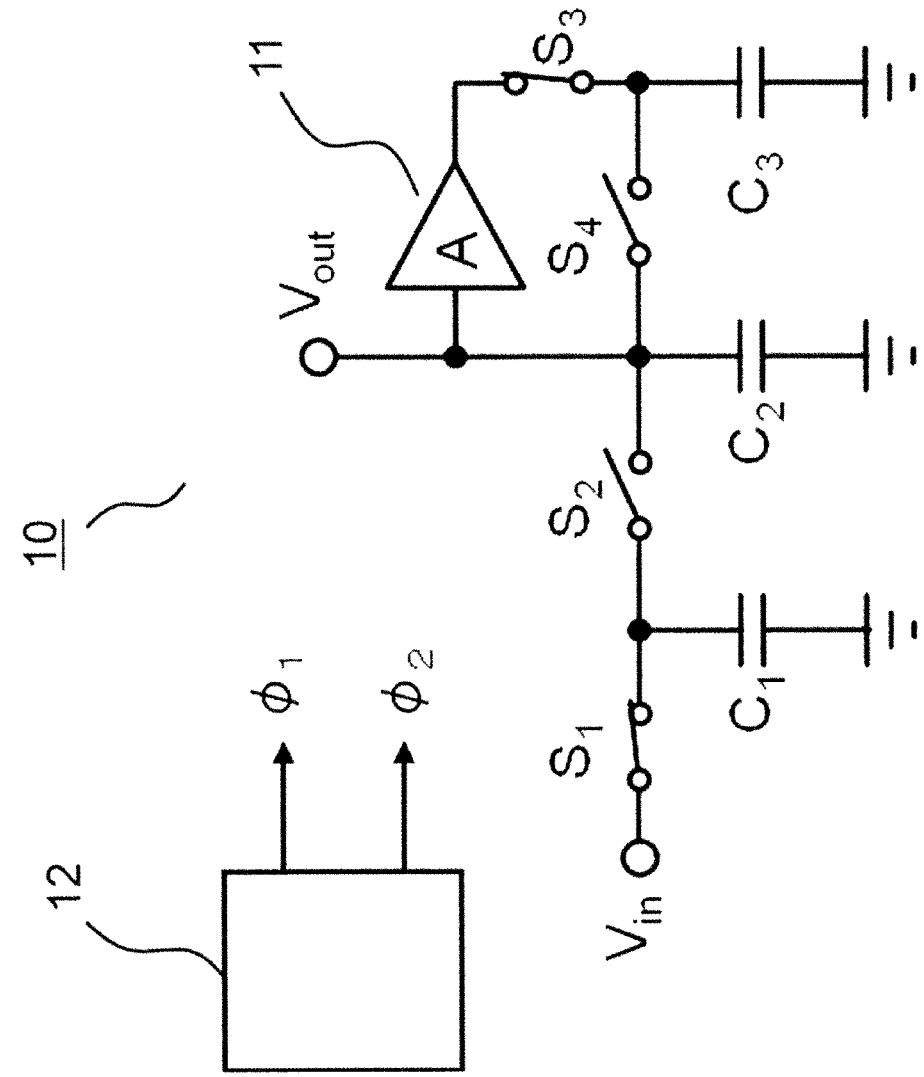

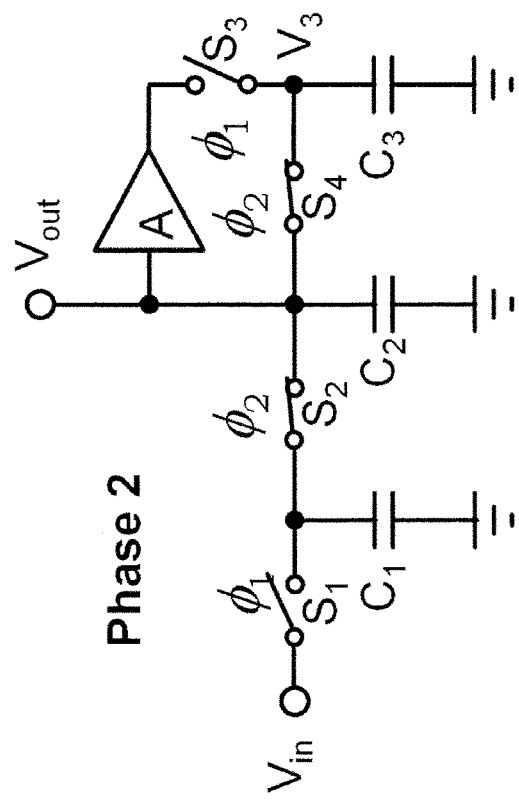
Fig. 2 Phase 1
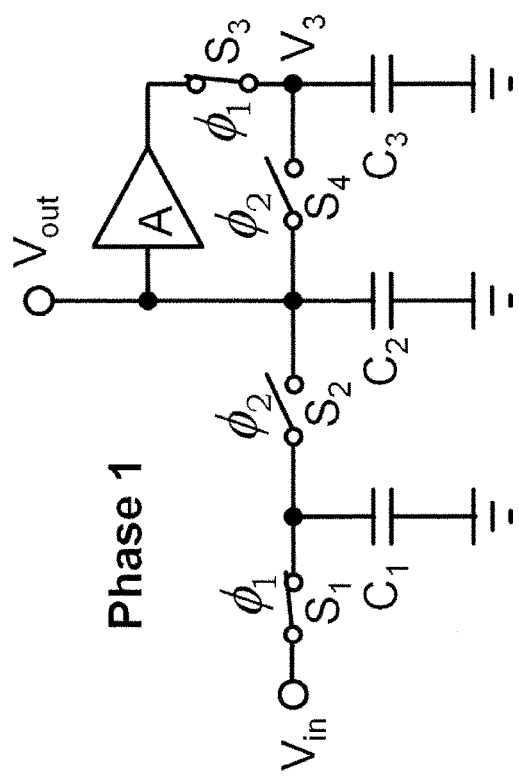
Fig. 3 Phase 2

INTEGRATOR AND A/D CONVERTER USING THE SAME

CROSS-REFERENCE TO RELATED APPLICATIONS

This application is based upon and claims the benefit of priority from the prior Japanese Patent Application No. 2016-135325, filed on Jul. 7, 2016, the entire contents of which are incorporated herein by reference.

FIELD

The present invention relates to an integrator and an A/D converter using the integrator. More specifically, the present invention relates to an integrator capable of stable high-speed operation and low-power-consumption operation, and an A/D converter using the integrator. Unlike conventional integrators, the integrator of the present invention does not incorporate negative feedback.

BACKGROUND (A Conventional Integrator)

FIG. 10 shows a conventional integrator 100. The integrator 100 generally uses a switched capacitor circuit and an operational amplifier 101. The switched capacitor circuit is inserted between an input terminal supplied with an input voltage $V_{in}$ and the operational amplifier 101. The switched capacitor circuit is configured of a switch $S_{101}$, a capacitor $C_S$, and a switch $S_{102}$. The switch $S_{101}$ connects either one of the input terminal supplied with the input voltage $V_{in}$ and the ground to one end of the capacitor $C_S$. The switch $S_{102}$ connects the other end of the capacitor $C_S$ to either one of an inverting input end (−) of the operational amplifier 101 and the ground. A positive input end (+) of the operational amplifier 101 is connected to the ground, and a negative feedback capacitor $C_F$ is inserted between an output end where $V_{out}$ appears and the inverting input end (−).

Next, the operation of the conventional integrator 100 is described. First, the switch $S_{101}$ selects the input terminal, and the switch $S_{102}$ selects the ground. In the capacitor $C_S$, charges $Q_S$ ($=V_{in}C_S$) are accumulated. In the next phase, the switch $S_{101}$ selects the ground, and the switch $S_{102}$ selects the inverting input end of the operational amplifier 101.

When the gain of the operational amplifier 101 is sufficiently large and establishes a virtual ground, the entire charges $Q_S$ accumulated in the capacitor $C_S$ are transferred to and accumulated in the capacitor $C_F$, where integrating operation is performed. A relation between an output voltage $V_{out}$ [n] of the integrator 100 at an n-th clock and an output voltage $V_{out}$ [n−1] of the integrator 100 at an (n−1)-th clock is represented by the following equation (P1).

$$V_{out}[n]=V_{out}[n-1]+(C_S/C_F)V_{in}[n] \quad (P1)$$

When the clock advances in this manner, the output voltage $V_{out}$ has a value obtained by integrating the input voltage $V_{in}$.

However, because a negative feedback technology is used as described above in the conventional integrator 100, the operation disadvantageously becomes unstable when the clock frequency is increased, and thus the operation highly depends upon clock frequency. As a result, there was a difficulty in stable high-speed operation.

(A Conventional Operational Amplifier)

An example of the circuit structure of a conventional operational amplifier 110 is shown in FIG. 11. The conventional operational amplifier 110 has a bias current source 111 configured so as to let a constant current $I_B$ flow toward the ground, letting the current $I_B$ in total flow through N-type transistors $M_{111}$ and $M_{112}$ configuring the paired differential transistors for biasing. A positive input voltage $V_{in\_p}$ is applied to the gate voltage of the N-type transistor $M_{111}$, and an inverting input voltage $V_{in\_n}$ is applied to the gate voltage of the N-type transistor $M_{112}$. P-type transistors $M_{113}$ and $M_{114}$ are configured to provide a current mirror to perform active loads, with their sources connected in common to a power supply voltage $V_{DD}$ and drains connected to the drains of the N-type transistors $M_{111}$ and $M_{112}$, respectively. The output voltage $V_{out}$ appears at a terminal to which the drain of the P-type transistor $M_{114}$ and the drain of the N-type transistor $M_{112}$ are commonly connected.

Next, the operation of the conventional operational amplifier 110 is described. With the current $I_B$ in total let flow through the N-type transistors $M_{111}$ and $M_{112}$ configuring paired differential transistors for biasing, an input voltage difference ($V_{in\_p}-V_{in\_n}$) is amplified to appear at the output end $V_{out}$. The output end $V_{out}$ is closer to $V_{DD}$ if the voltage $V_{in\_p}$ is higher than the voltage $V_{in\_n}$ and otherwise the output end $V_{out}$ is closer to the ground potential.

In the integrator with the above-described conventional operational amplifier 110, it is known that a gain bandwidth GBW is required to be in the order of twice as large as a clock frequency $f_{clk}$ for operating a switched capacitor circuit. When the bias current is $I_B$ and the load capacitor of the output end is $C_L$, the gain bandwidth GBW is represented by the following equation (P2).

$$GBW=g_m/(2\pi C_L)\approx(I_B/V_{eff})/(2\pi C_L) \quad (P2)$$

Here, $V_{eff}$ is an effective gate voltage, and is given by $V_{eff}=V_{GS}-V_T$, where $V_{GS}$ is a source to gate voltage and $V_T$ is a threshold voltage.

In the integrator 100 with the above-described operational amplifier 110, operation with variable clock frequency is desired. However, this is difficult with the conventional integrator, because a necessary GBW cannot be achieved and the integrator cannot operate appropriately unless the bias current $I_B$ is proportional to the clock frequency $f_{clk}$. Since changes in the bias current $I_B$ renders changes in the bias point, it is difficult to adjust the bias current $I_B$ for a large extent. Even if the necessary GBW could be achieved at a low clock frequency, it is difficult to greatly decrease the current, posing another problem of a greater power consumption.

(A Conventional Delta Sigma A/D Converter)

The integrator 100 can be incorporated in, for example, a delta sigma A/D converter 120 shown in FIG. 12. The delta sigma A/D converter 120 is configured to have a plurality of integrators arranged in several stages connected to a comparator 124. The integrators are a first integrator 121, a second integrator 122, . . . , an n-th integrator 123 (each integrator has the same internal structure). The delta sigma A/D converter 120 has a comparison output $D_{out}$ fed back to an input stage. In this configuration, the voltage of the first integrator 121 at the time of charge transfer is switched to $V_{REF+}$ or $V_{REF-}$ by a switch $S_{103}$.

The above-described delta sigma A/D converter 120 has a signal-to-noise ratio (SNR) indicating its performance represented by the following equation (P3).

$$SNR=(3/2)((2L+1)/\pi^{2L})(2N-1)^2 \cdot M^{2L+1} \quad (P3)$$

Here, L is the number of steps of the integrator, N is the number of quantization bits of the comparator, and M is an oversampling ratio. When an input signal frequency is $f_{in}$ and a sampling frequency is $f_s$, the oversampling ratio M is represented by the following equation (P4).

$$M=f_s/(2f_{in}) \tag{P4}$$

Even if the number of steps of the integrator and the number of quantization bits of the comparator are not changed, by setting the oversampling ratio M, the SNR can be variable. To obtain the same SNR for various input signal frequencies $f_{in}$, the sampling frequency $f_s$ is made proportional to the input signal frequency $f_{in}$. However, as described above, it is difficult for the conventional integrator 100 to make the operating frequency variable and optimize power consumption, and it is thus difficult to make the sampling frequency of the delta sigma A/D converter variable and optimize power consumption (refer to Japanese Laid-Open Patent Application Publication No. H05-37300).

SUMMARY

An integrator according to one aspect of the present invention includes a first switch one terminal of which is connected to an input terminal, a first capacitor connected between a reference voltage terminal and another terminal of the first switch, a second switch connected between an output terminal and the other terminal of the first switch, a second capacitor connected between the reference voltage terminal and the output terminal, an amplifier having an input connected to the output terminal and an output, the amplifier amplifying a voltage at the output terminal, a third switch one terminal of which is connected to the output of the amplifier, a forth switch connected between the output terminal and another terminal of the third switch, a third capacitor connected between the reference voltage terminal and the other terminal of the third switch, and a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

In the above-described integrator, a first capacitance C1 of the first capacitor, a third capacitance C3 of the third capacitor, and a gain A of the amplifier are desired to satisfy the following equation:

$$C1=(A-1)\cdot C3$$

In the above-described integrator, the amplifier is desired to be a dynamic type amplifier.

In the above-described integrator, the amplifier is desired to include a first and a second output capacitors, a pre-charge circuit connected to the first and the second output capacitors, the pre-charge circuit pre-charging the first and the second output capacitors, and a discharge circuit connected to the first and the second output capacitors, the discharge circuit selectively discharging one of the first and the second output capacitors in response to a voltage applied to the input of the amplifier.

In the above-described integrator, the amplifier is desired to further include plural pears of transistors with different gate-width/gate-length ratios, each of the plural pears of transistors being supplied with a plurality of input signal pairs.

A delta sigma A/D converter of another aspect of the present invention includes a plurality of integrators connected in series, each of the plurality of integrators comprising a first switch one terminal of which is connected to an input terminal, a first capacitor connected between a reference voltage terminal and another terminal of the first switch, a second switch connected between an output terminal and the other terminal of the first switch, a second capacitor connected between the reference voltage terminal and the output terminal, an amplifier having an input connected to the output terminal and an output, the amplifier amplifying a voltage at the output terminal, a third switch one terminal of which is connected to the output of the amplifier, a forth switch connected between the output terminal and another terminal of the third switch, a third capacitor connected between the reference voltage terminal and the other terminal of the third switch, and a control circuit repeating a first phase and a second phase the control circuit rendering, in the first phase, the first switch and the third switch to turn on and the second switch and the fourth switch to turn off, and in the second phase, the second switch and the fourth switch to turn on and the first switch and the third switch to turn off.

The above-described delta sigma A/D converter is desired to further include plurality of adders, each of the plurality of adders connected to an output of the corresponding one of the plurality of integrators, respectively; and plurality of feed forward paths, each of the plurality of feed forward paths feeding an input signal supplied to a corresponding one of the plurality of integrators to a corresponding one of the adders, respectively.

In the above-described delta sigma A/D converter, a first capacitance C1 of the first capacitor, a third capacitance C3 of the third capacitor, and a gain A of the amplifier are desired to satisfy the following equation:

$$C1=(A-1)\cdot C3$$

In the above-described delta sigma A/D converter, the amplifier is desired to be a dynamic type amplifier.

In the above-described delta sigma A/D converter, the amplifier is desired to include a first and a second output capacitors, a pre-charge circuit connected to the first and the second output capacitors, the pre-charge circuit pre-charging the first and the second output capacitors, and a discharge circuit connected to the first and the second output capacitors, the discharge circuit selectively discharging one of the first and the second output capacitors in response to a voltage applied to the input of the amplifier.

In the above-described delta sigma A/D converter, the amplifier is desired to further include plural pears of transistors with different gate-width/gate-length ratios, each of the plural pears of transistors being supplied with a plurality of input signals.

An A/D converter of still another aspect of the present invention includes a successive approximation A/D converter for generating an output voltage, and a delta sigma A/D converter connected to the successive approximation A/D converter, the delta sigma A/D converter receiving the output voltage of the successive approximation A/D converter, wherein the delta sigma A/D converter comprises, a plurality of integrators connected in series, each of the plurality of integrators comprising, a first switch one terminal of which is connected to an input terminal, a first capacitor connected between a reference voltage terminal and another terminal of the first switch, a second switch connected between an output terminal and the other terminal of the first switch, a second capacitor connected between the reference voltage terminal and the output terminal, an amplifier having an input connected to the output terminal and an output, the amplifier amplifying a voltage at the output terminal, a third switch one terminal of which is connected to the output of the amplifier, a forth switch connected between the output terminal and another terminal of the third switch, a third capacitor connected between the reference voltage terminal and the other terminal of the third switch, and a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

The above-described A/D converter is desired to further include a voltage shift circuit connected to the successive approximation A/D converter and the delta sigma A/D converter, the voltage shift circuit shifting the output voltage of the successive approximation A/D converter with a pre-determined voltage, and for supplying a sifted voltage to the delta sigma A/D converter.

In the above-described A/D converter, the successive approximation A/D converter is desired to perform a binary search in a limited input voltage range.

In the above-described A/D converter, a first capacitance C1 of the first capacitor, a third capacitance C3 of the third capacitor, and a gain A of the amplifier are desired to satisfy the following equation:

$$C1=(A-1)\cdot C3$$

In the above-described A/D converter, the amplifier is desired to be a dynamic type amplifier.

In the above-described A/D converter, the amplifier is desired to include a first and a second output capacitors, a pre-charge circuit connected to the first and the second output capacitors, the pre-charging circuit pre-charging the first and the second output capacitors, and a discharge circuit connected to the first and the second output capacitors, the discharging circuit selectively discharging one of the first and the second output capacitors in response to a voltage applied to the input of the amplifier.

In the above-described A/D converter, the amplifier is desired to further include plural pears of transistors with different gate-width/gate-length ratios, each of the plural pears of transistors being supplied with a plurality of input signals.

BRIEF DESCRIPTION OF DRAWINGS

FIG. 1 is a circuit diagram of an integrator according to one embodiment of the present invention;

FIG. 2 is a circuit diagram for describing operation of the integrator according to one embodiment of the present invention;

FIG. 3 is a circuit diagram for describing operation of the integrator according to one embodiment of the present invention;

Figure 4:
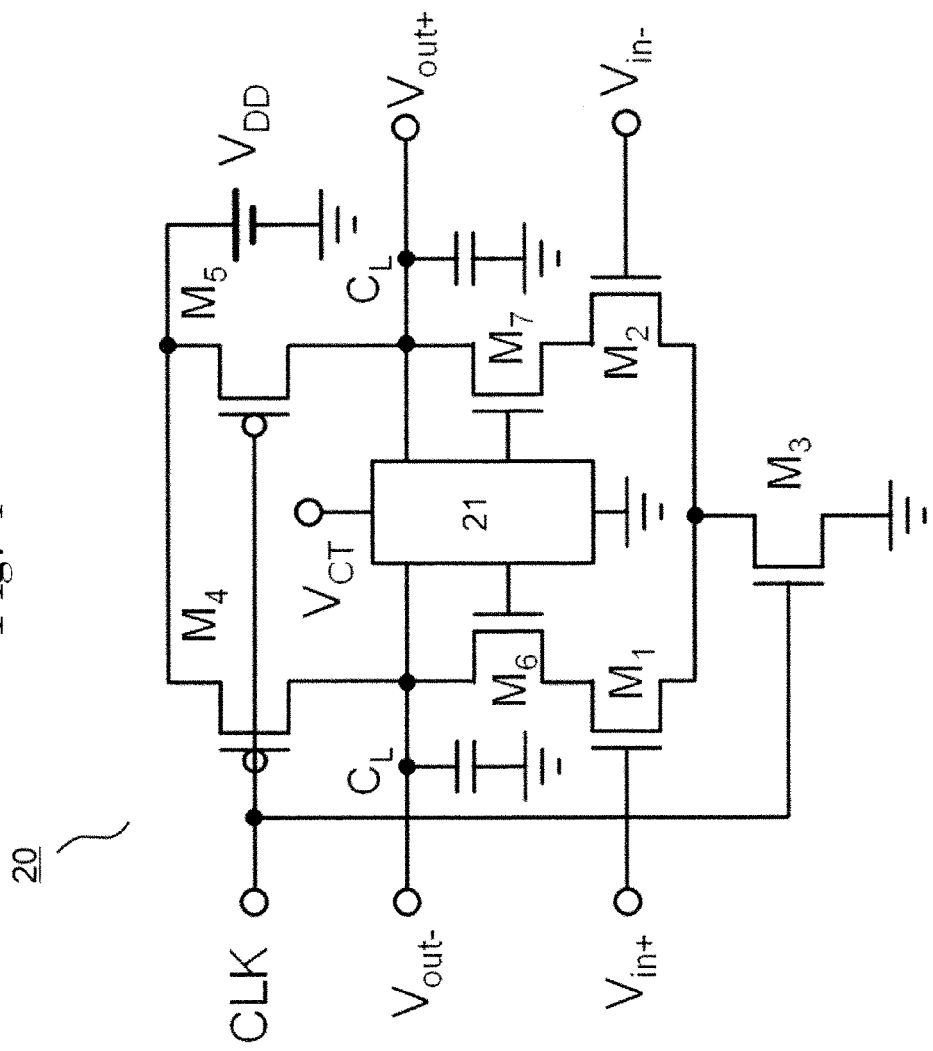
FIG. 4 is a circuit diagram of a dynamic type amplifier according to one embodiment of the present invention.

DESCRIPTION OF EMBODIMENTS (An Embodiment Regarding Integrator and Dynamic Type Amplifier for Use in the Integrator)

FIG. 1 shows an integrator 10 according to one embodiment of the present invention. The integrator 10 is configured of three capacitors $C_1$, $C_2$, and $C_3$, four switches $S_1$, $S_2$, $S_3$, and $S_4$, and one amplifier 11. The capacitor $C_1$ is a capacitor which mainly retains an input voltage $V_{in}$. The capacitor $C_2$ is a capacitor which mainly retains a previous output voltage $V_{out}$. The capacitor $C_3$ is a capacitor which retains a voltage obtained by amplifying a previous output voltage $V_{out}$ by A times.

The switch $S_1$ is inserted between an input terminal supplied with the input voltage $V_{in}$ and one end of the capacitor $C_1$. The other end of the capacitor $C_1$ is connected to a reference voltage terminal (ground). One end of the capacitor $C_2$ is connected to an output terminal where $V_{out}$ appears, and the other end of the capacitor $C_2$ is connected to the reference voltage terminal (ground). The switch $S_2$ is inserted between the one end of the capacitor $C_1$ (also one end of the switch $S_1$) and the one end of the capacitor $C_2$ (also the output terminal). The switch $S_4$ is inserted between the one end of the capacitor $C_2$ (also the output terminal) and one end of the capacitor $C_3$ (also one end of the switch $S_3$). The other end of the capacitor $C_3$ is connected to the reference voltage terminal (ground). An input of the amplifier 11 is coupled to the one end of the capacitor $C_2$ (also the output terminal), and the switch $S_3$ is inserted between an output of the amplifier 11 and the one end of the capacitor $C_3$. The switches $S_1$ to $S_4$ can be configured by a transfer gate in which a P-type transistor and an N-type transistor are connected in parallel and driven by a control signal in a complementary manner.

A control circuit 12 generates a control signal $\phi_1$ for controlling the switches $S_1$ and $S_3$ and a control signal $\phi_2$ for controlling the switches $S_2$ and $S_4$. In Phase 1, the control circuit 12 performs control so that the input signal is sampled in the capacitor $C_1$ and the voltage remaining in the capacitor $C_2$ is amplified by the amplifier 11 by A times in gain to appear at the capacitor $C_3$. In phase 2, the control circuit 12 performs control so that a voltage occurring due to parallel connection of the capacitors $C_1$, $C_2$, and $C_3$ is taken as an output. Thus, a voltage at the output terminal is amplified by the amplifier 11.

FIG. 2 and FIG. 3 are diagrams for describing operation of the integrator according to one embodiment of the present invention. In Phase 1, the control circuit 12 renders the switches $S_1$ and $S_3$ closed (turn on), and the switches $S_2$ and $S_4$ open (turn off). This state is shown in FIG. 2. The input voltage $V_{in}$ is applied to the capacitor $C_1$. A voltage obtained by amplifying the previous output voltage $V_{out}[n-1]$ by A times in gain is applied to the capacitor $C_3$. Charges $Q_1$, $Q_2$, and $Q_3$ accumulated in the capacitors $C_1$, $C_2$, and $C_3$ in this state are represented by the following equations (1-1) to (1-3), respectively.

$$Q_1=C_1 V_{in} \tag{1-1}$$

$$Q_2=C_2 V_{out}[n-1] \tag{1-2}$$

$$Q_3=A \cdot C_3 V_{out}[n-1] \tag{1-3}$$

Next, in Phase 2, the control circuit 12 renders the switches $S_2$ and $S_4$ closed (turn on), and the switches $S_1$ and $S_3$ open (turn off). Here, the three capacitors are all connected in parallel and have a voltage of $V_{out}(n)$, which is represented by the following equation (2).

$$V_{out}[n]=(Q_1+Q_2+Q_3)/(C_1+C_2+C_3)=(C_1V_{in}+(C_2+A\cdot C_3)V_{out}[n-1])/(C_1+C_2+C_3) \quad (2)$$

Here, constants are defined by the following equations (3-1) and (3-2).

$$C_1=(A-1)\cdot C_3 \quad (3\text{-}1)$$

$$K=C_1/(C_1+C_2+C_3) \quad (3\text{-}2)$$

Then, $V_{out}(n)$ is represented by the following equation (4).

$$V_{out}[n]=V_{out}[n-1]+KV_{in} \quad (4)$$

That is, integrating operation is achieved in the circuit of FIG. 1. The values of the above constants are defined by the following equations (5-1) to (5-4) by using a unit capacitor $C_u$.

$$C_1=2C_u \quad (5\text{-}1)$$

$$C_2=C_u \quad (5\text{-}2)$$

$$C_3=C_u \quad (5\text{-}3)$$

$$A=3 \quad (5\text{-}4)$$

Then, $V_{out}(n)$ is represented by the following equation (6).

$$V_{out}[n]=V_{out}[n-1]+(1/2)V_{in} \quad (6)$$

As described above, in the present invention, an integrator can be configured even without a negative feedback circuit. The present invention can solve the problems of instability and low-speed operation in the conventional integrator 100 and can achieve a stable and high-speed integrator.

While a single-phase integrator is shown in FIG. 1, the integrator can also be configured to deal with a complementary signal. In addition, a so-called chopper-type integrator can be used in which the input and output signal polarities of the complementary signal are cyclically switched. Furthermore, the integrator shown in FIG. 1 may include, as required, an input buffer or an input amplifier and an output buffer or an output amplifier.

In the integrator of FIG. 1, a dynamic type amplifier where a steady-state current does not flow can be used as the amplifier 11 to obtain a great advantage. Consumption energy $E_d$ of the dynamic type amplifier is determined mainly by charge/discharge current of the output capacitor $C_L$. Therefore, an ideal power characteristic can be obtained such that power consumption is proportional to the clock frequency and, although power is consumed to some degree in high-speed operation, if the clock frequency is decreased, power consumption is decreased. Thus, unlike the conventional integrator, it is not required to control the bias current every time the clock frequency is changed. In addition, since no constant-state current flow, an integration circuit operating with significantly low power consumption can be achieved.

FIG. 4 shows an example of a dynamic type amplifier 20. The drain of an N-type transistor $M_3$ is connected to the common source of N-type transistors $M_1$ and $M_2$ configuring paired differential transistors (discharging circuit). A positive input $V_{in+}$ is supplied to the gate of the N-type transistor $M_1$, and an inverting input $V_{in-}$ is supplied to the gate of the N-type transistor $M_2$. A clock signal CLK is supplied to the gate of the N-type transistor $M_3$, and its source is grounded. The clock signal CLK is supplied to both of the gates of P-type transistors $M_4$ and $M_5$ as loads, and their sources are both supplied with the power supply voltage $V_{DD}$ (precharging circuit). The drain of the P-type transistor $M_4$ is connected to an inverting output terminal, where the output capacitor $C_L$ is present. The voltage $V_{out-}$ appears at the inverting output terminal. An N-type transistor $M_6$ is inserted between the drain of the P-type transistor $M_4$ and the drain of the N-type transistor $M_1$. The drain of the P-type transistor $M_5$ is connected to a positive output terminal, where the output capacitor $C_L$ is present. The voltage $V_{out+}$ appears at the positive output terminal. An N-type transistor $M_7$ is inserted between the drain of the P-type transistor $M_5$ and the drain of the N-type transistor $M_2$. An output voltage of a common voltage detection/control circuit 21 is supplied to the gates of the N-type transistors $M_6$ and $M_7$. The common voltage detection/control circuit 21 is controlled by a control signal $V_{CT}$ and also by each of the voltages $V_{out-}$ and $V_{out+}$ of the positive and inverting output terminals.

Figure 5:
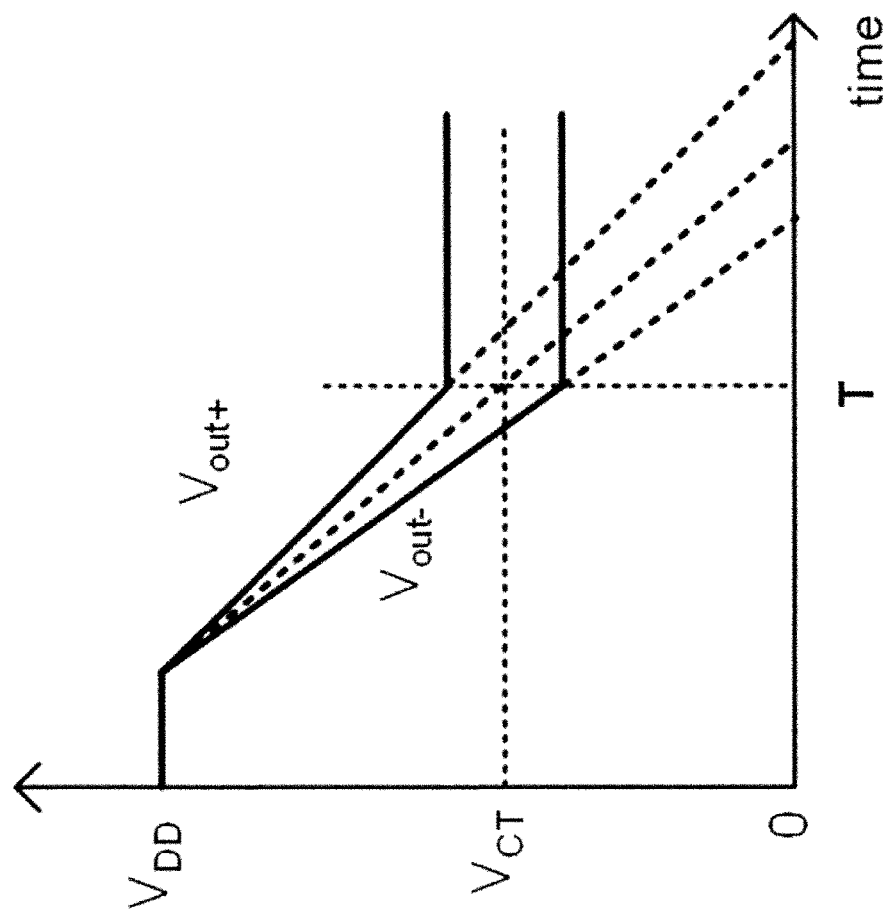
FIG. 5 is a graph showing an operation of the dynamic type amplifier according to one embodiment of the present invention.

The operation of the dynamic type amplifier 20 is described by using temporal changes of the output voltages $V_{out+}$ and $V_{out-}$ of FIG. 5.

First, the clock signal CLK is set at a ground level. In this state, the N-type transistor $M_3$ is interrupted, and no current flows through the N-type transistors $M_1$ and $M_2$. As a result, the output voltages $V_{out+}$ and $V_{out-}$ both become the power supply voltage $V_{DD}$, and the output capacitor $C_L$ is precharged at $V_{DD}$.

Next, the clock signal CLK is raised to a $V_{DD}$ level. The P-type transistors $M_4$ and $M_5$ become unconductive, and the N-type transistor $M_3$ becomes conductive. As a result, current flows through the N-type transistors $M_1$ and $M_2$. Here, the common voltage detection/control circuit 21 supplies an operating voltage so that the transistors $M_6$ and $M_7$ become in an ON state. The current of the N-type transistors $M_1$ and $M_2$ acts so as to draw the charges accumulated in the output capacitor $C_L$, thereby decreasing both the output voltages $V_{out+}$ and $V_{out-}$. Currents $I_{D1}$ and $I_{D2}$ flowing through the N-type transistors $M_1$ and $M_2$ are represented by the following equations (7-1) and (7-2), where trans conductance is $g_m$, $I_{D0}$ is an average current of $I_{D1}$ and $I_{D2}$, and $\Delta V_{in}=V_{in+}-V_{in-}$.

$$I_{D1}=I_{D0}\pm g_m(\Delta V_{in}/2) \quad (7\text{-}1)$$

$$I_{D2}=I_{D0}-g_m(\Delta V_{in}/2) \quad (7\text{-}2)$$

Therefore, the output voltages $V_{out+}$ and $V_{out-}$ are represented by the following equations (8-1) and (8-2).

$$V_{out+}=V_{DD}-I_{D2}t/C_L \quad (8\text{-}1)$$

$$V_{out-}=V_{DD}-I_{D1}t/C_L \quad (8\text{-}2)$$

A differential gain $G_d$ is found and represented by the following equation (9) where $\Delta V_{out}=V_{out+}-V_{out-}$.

$$G_d=\Delta V_{out}/\Delta V_{in}=g_m(t/C_L) \quad (9)$$

Here, an output common voltage $V_C$ is defined as $V_C=(V_{out+}+V_{out-})/2$, this is represented by the following equation (10).

$$V_C=V_{DD}-I_{D0}t/C_L \quad (10)$$

When a change of the output common voltage $V_C$ from the power supply voltage is $-\Delta V_C$, $\Delta V_C$ is represented by the following equation (11).

$$\Delta V_C=I_{D0}t/C_L \quad (11)$$

When the equation (9) is substituted for the equation (11), the following equation (12) holds.

$$G_d=g_m(\Delta V_C/I_{D0})=(2I_{D0}/V_{eff})\cdot(\Delta V_C/I_{D0})=2\Delta V_C/V_{eff} \quad (12)$$

Therefore, the differential gain $G_d$ can be achieved by detecting a common mode voltage and turning off the N-type transistors $M_6$ and $M_7$ when the voltage becomes the set voltage $V_{CT}$. The output voltage after turning off is retained. This turning off in the N-type transistors $M_6$ and $M_7$ is controlled by the common voltage detection/control circuit 21.

The consumption energy $E_d$ of this dynamic type amplifier is determined mainly by a charge/discharge current of the output capacitor $C_L$, and is represented by the following equations (13) and (14).

$$E_d = 2C_L V_{DD}(V_{DD} - V_{CT}) \tag{13}$$

$$E_d = 2C_L V_{DD} \Delta V_C = C_L V_{DD} G_d V_{\mathit{eff}} \tag{14}$$

Power consumption $P_d$ is represented by the following equation (15), where the clock frequency is $f_{CLK}$.

$$P_d = f_{CLK} E_d = f_{CLK} C_L V_{DD} G_d V_{\mathit{eff}} \tag{15}$$

Therefore, an ideal power characteristic can be obtained such that power consumption is proportional to the clock frequency and, although power is consumed to some degree in high-speed operation, if the clock frequency is decreased, power consumption is decreased accordingly in proportion to the decrease. Thus, unlike the conventional integrator, it is not required to control the bias current every time the clock frequency is changed. In addition, since no steady-state current flows, an integration circuit operating with significantly low power consumption can be achieved.

(An Embodiment Regarding Delta Sigma A/D Converter)

Figure 6:
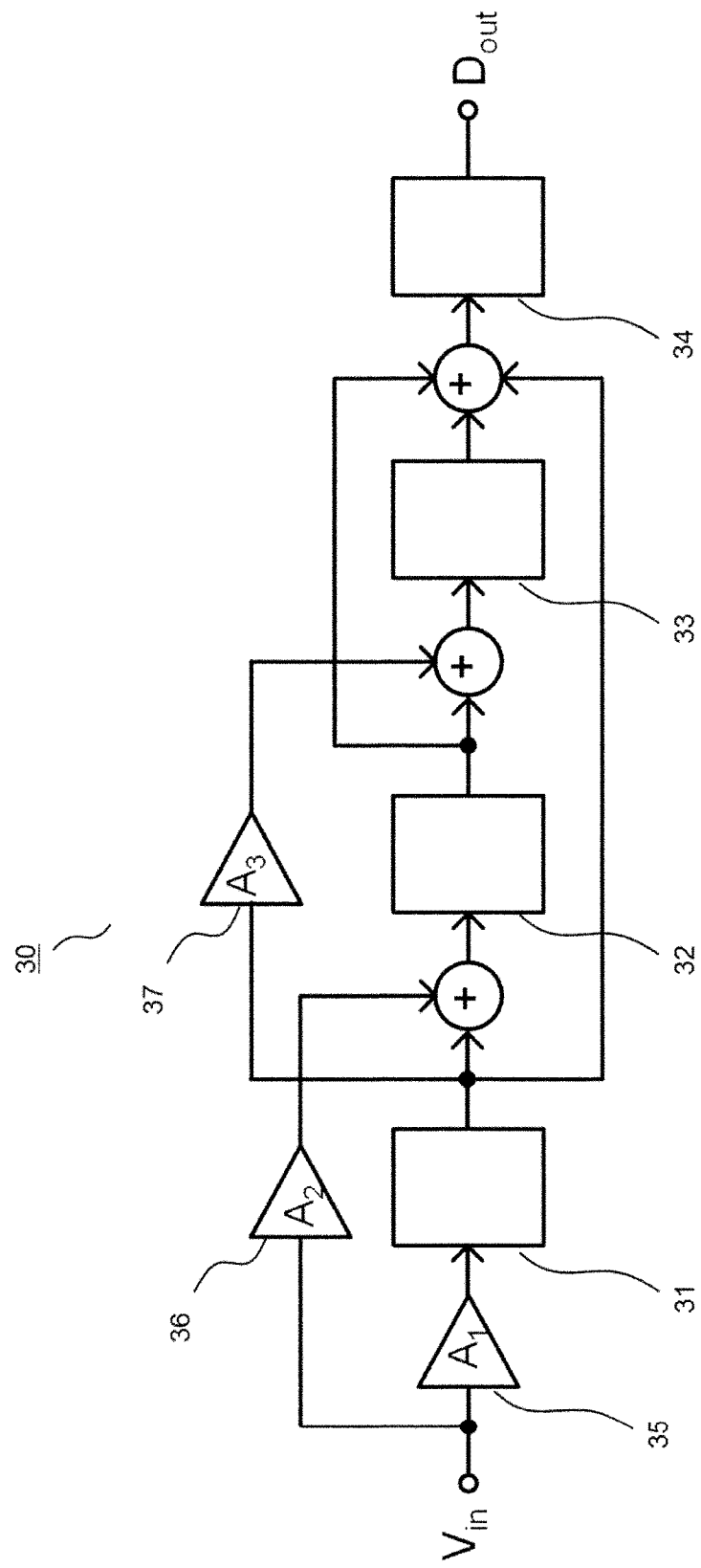
FIG. 6 is a circuit diagram of a delta sigma A/D converter according to one embodiment of the present invention.

A delta sigma A/D converter 30 according to one embodiment of the present invention is shown in FIG. 6. This delta sigma A/D converter 30 uses the integrator 10 shown in FIG. 1, and the amplifier 11 of the integrator 10 is the dynamic type amplifier 20 shown in FIG. 4.

A three-stage integrator including a first integrator 31, a second integrator 32, and a third integrator 33 (each integrator has the same internal structure and is the integrator 10 showed in FIG. 1) is arranged in series and connected to the comparator (quantizer) 34 to generate a comparison output $D_{out}$. Pluralities of adders (a first adder, a second adder, and a third adder) are connected to an output of the each integrator, respectively. The input voltage $V_{in}$ is amplified with an amplification factor $A_1$ and supplied to the first integrator 31. The input voltage $V_{in}$ is amplified with an amplification factor $A_2$ summed with an output form the first integrator 31 at the first adder, is then supplied to the second integrator 32. The output from the first integrator 31 is amplified with an amplification factor $A_3$ summed with an output from the second integrator 32 at the second adder, is then supplied to the third integrator 33. The output from the first integrator 31, the output from the second integrator 32, and the output from the third integrator 33 are summed at the third adder and supplied to the quantizer 34. In this manner, a so-called feed-forward path for amplification with one or predetermined number of amplification factors ($A_1$, $A_2$, and $A_3$) and addition of the resultant voltages and the outputs of the integrators on the subsequent stages together is provided for phase compensation. The amplification with the predetermined amplification factors and the addition can be easily achieved by slightly changing the structure of the above-described dynamic type amplifier 20 to increase the number of input terminals, although the amplification and the addition can also be configured by separately providing amplifiers 35, 36, and 37.

Figure 7:
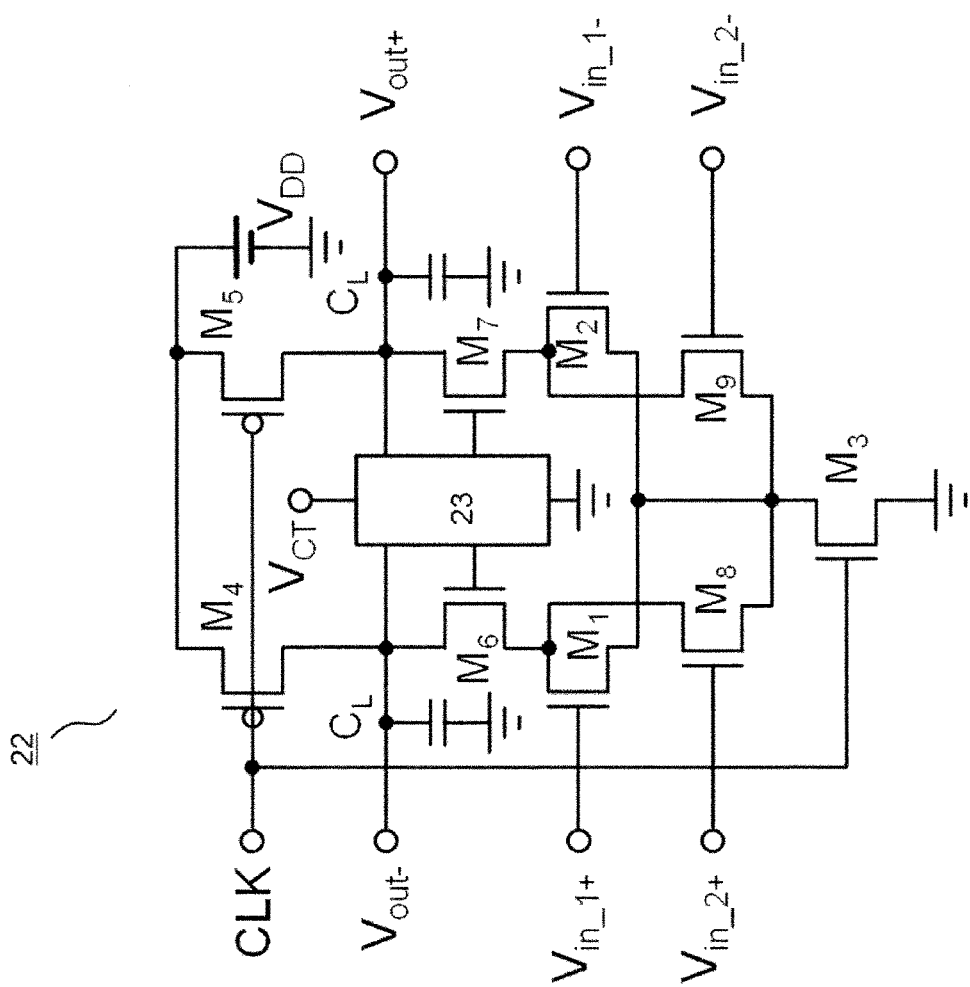
FIG. 7 is a circuit diagram of a dynamic type amplifier for use in the delta sigma A/D converter according to one embodiment of the present invention.

FIG. 7 shows an example of a dynamic type amplifier 22 according to a modified example. A difference from FIG. 4 is that N-type transistors $M_8$ and $M_9$ configuring paired differential transistors are added. The drain of the N-type transistor $M_3$ is connected to a common source of the N-type transistors $M_8$ and $M_9$. A positive input $V_{in\_2+}$ is supplied to the gate of the N-type transistor $M_8$, and an inverting input $V_{in\_2-}$ is supplied to the gate of the N-type transistor $M_9$, each input being a second input signal. A positive input $V_{in\_1+}$ of a first input signal is supplied to the gate of the N-type transistor $M_1$, and an inverting input $V_{in\_1-}$ thereof is supplied to the gate of the N-type transistor $M_2$.

Here, for the N-type transistors $M_1$ and $M_2$, if a gate-width/gate-length ratio, that is, a W/L ratio, of each of the N-type transistors $M_8$ and $M_9$, is at k times, the second input signal has an amplification factor of substantially k times. Therefore, a k-fold amplifier can be configured.

(An Embodiment Regarding A/D Converter in a Composite Structure)

Combining a delta sigma modulator configured of the integrator using the dynamic type amplifier of the present invention with a successive approximation A/D converter (SAR ADC) can achieve a higher-speed A/D converter with low power consumption. The successive approximation A/D converter uses capacitors and a dynamic comparator.

Figure 8:
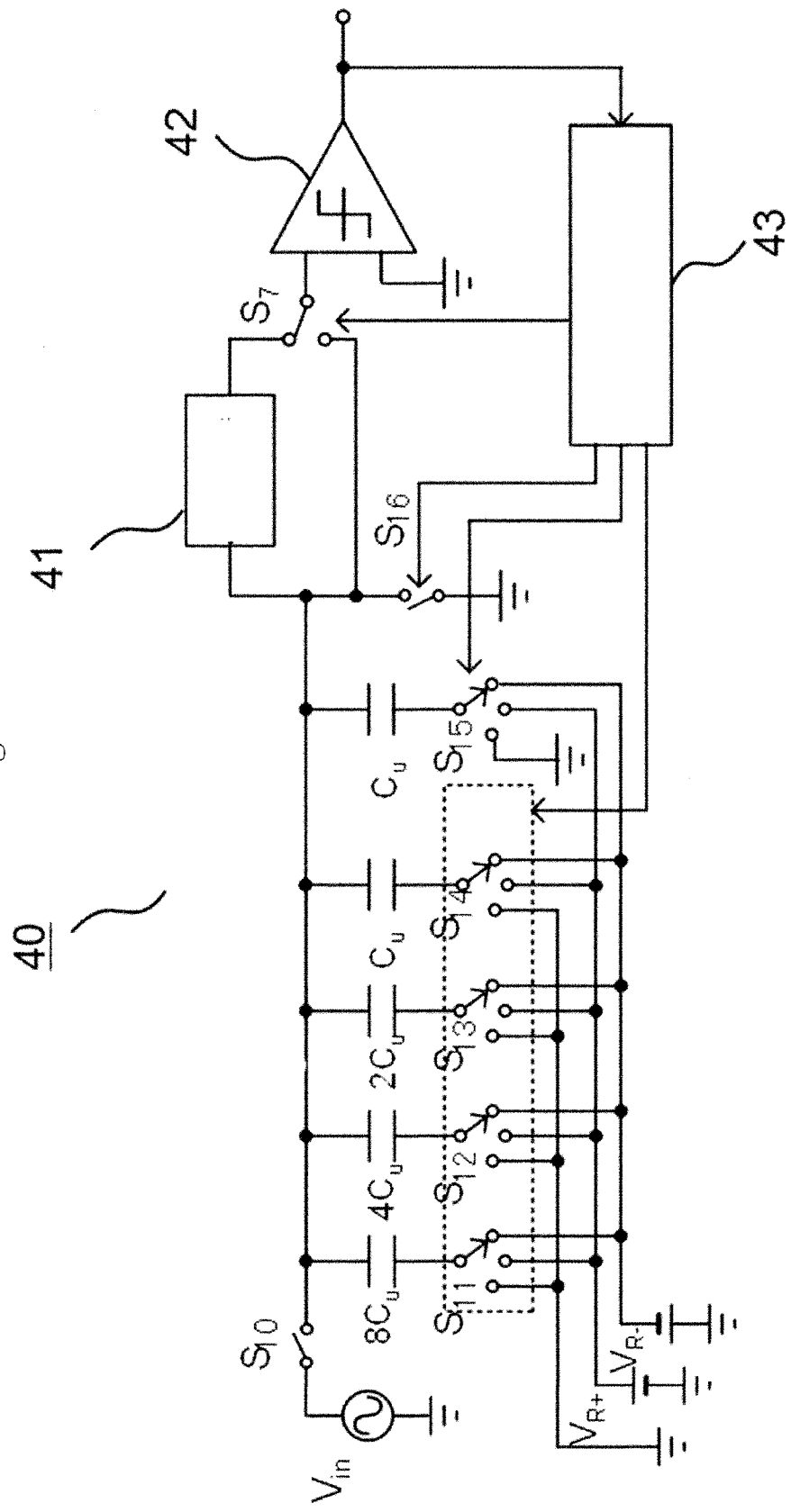
FIG. 8 is a circuit diagram of a composite A/D converter according to one embodiment of the present invention.

FIG. 8 shows an A/D converter in a composite structure. A signal line from an input end where the input voltage $V_{in}$ is supplied is connected via a switch $S_{10}$ in parallel to one end of each of capacitors eight times, four times, two times, one time, and one time larger in capacitance than the reference capacitor $C_u$. Switches $S_{11}$, $S_{12}$, $S_{13}$, $S_{14}$, and $S_{15}$ are selectively supply ground voltage, $V_{R+}$ or $V_{R-}$ at the other end of each of the capacitors $8C_u$, $4C_u$, $2C_u$, $C_u$, and $C_u$. A delta sigma converter 41 is the one already described with reference to FIG. 6 and FIG. 7. A switch $S_7$ selectively outputs an output of the signal line and an output of the delta sigma converter 41 to a comparator (quantizer) 42. A control circuit 43 performs conduction control over switches $S_{10}$, $S_{16}$, $S_7$, $S_{11}$, $S_{12}$, $S_{13}$, $S_{14}$, and $S_{15}$ in accordance with the output of the comparator 42.

First, the switch $S_{10}$ is closed, and the switches $S_{11}$ to $S_{15}$ are selected as ground. Subsequently, the switch $S_{16}$ is opened, and a signal line is selected for the switch $S_7$. Next, instantly when the switch $S_{10}$ is opened, the input signal $V_{in}$ is sampled, and the charge on the signal line is retained. The comparator 42 operates to determine a polarity to determine MSB. In accordance with the state of the comparator 42, the switches $S_{11}$ to $S_{14}$ sequentially select $V_{R+}$ or $V_{R-}$ to determine a conversion value of each bit, and the voltage on the signal line decreases. Once LSB is determined, the switch $S_7$ selects the delta sigma converter 41 to operate the delta sigma converter 41. In accordance with a conversion output from the comparator 42, the switch $S_{15}$ selects $V_{R+}$ or $V_{R-}$. By operation as a delta sigma A/D converter, A/D conversion with higher resolution can be performed.

In the composite A/D converter 40 with a delta sigma converter and a SAR ADC combined together, it is more advantageous in performing A/D conversion operation than in a single SAR ADC.

Figure 9:
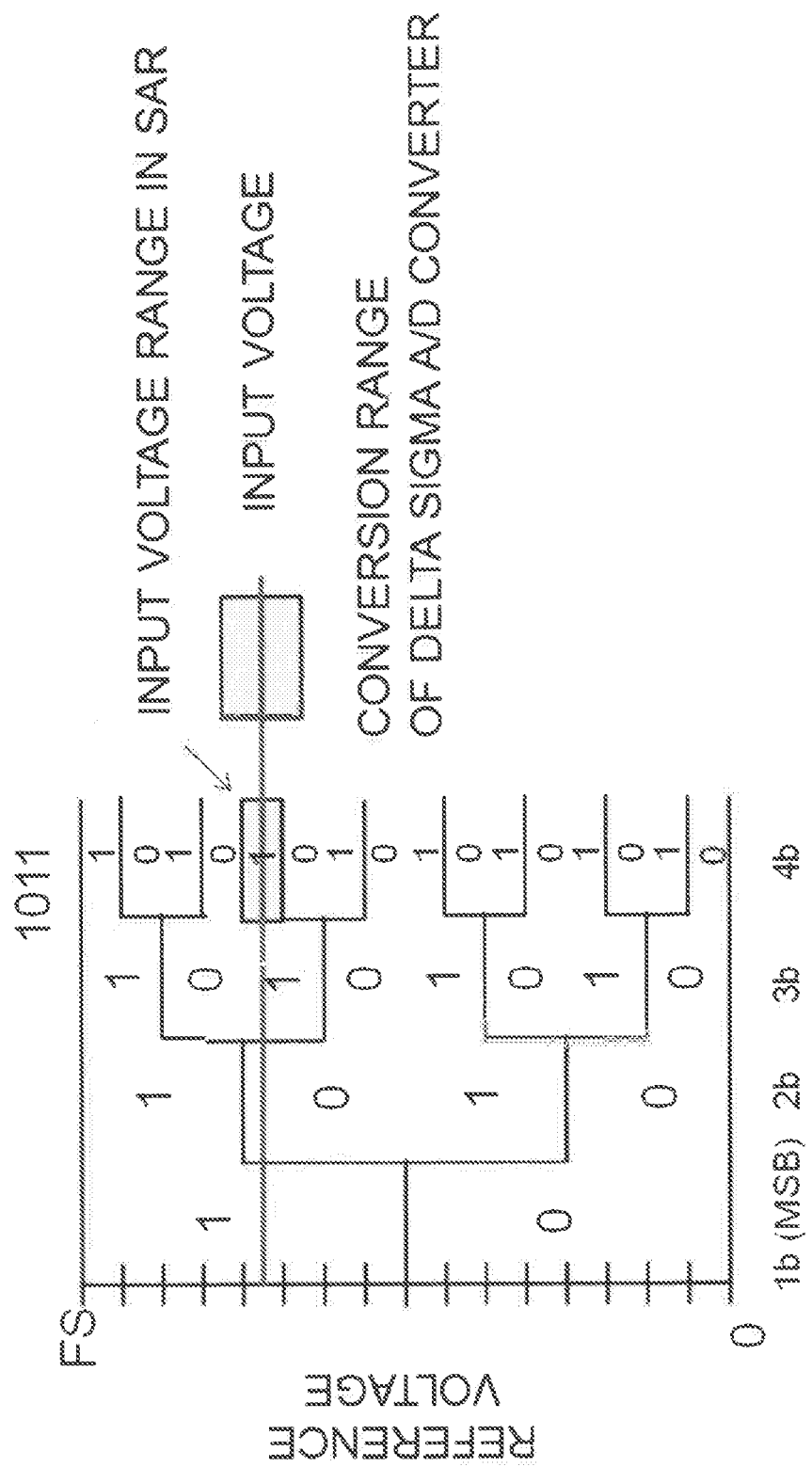
FIG. 9 is a graph showing an operation of the composite A/D converter according to one embodiment of the present invention.
Figure 10:
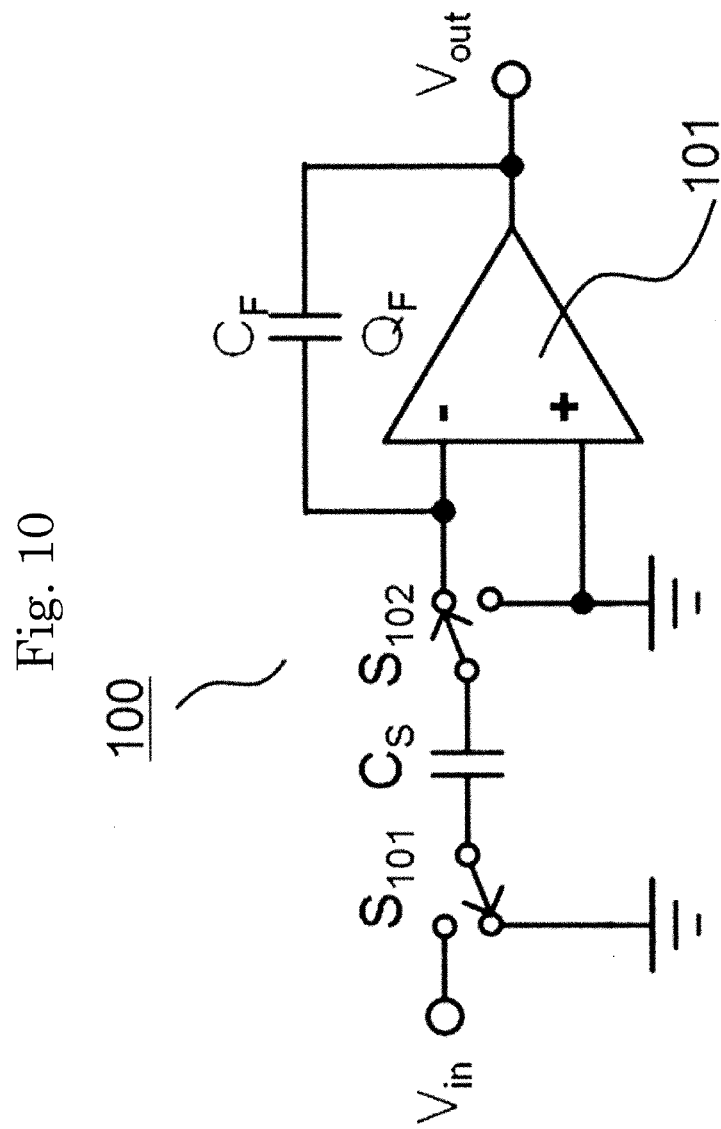
FIG. 10 is a circuit diagram of a conventional integrator.
Figure 11:
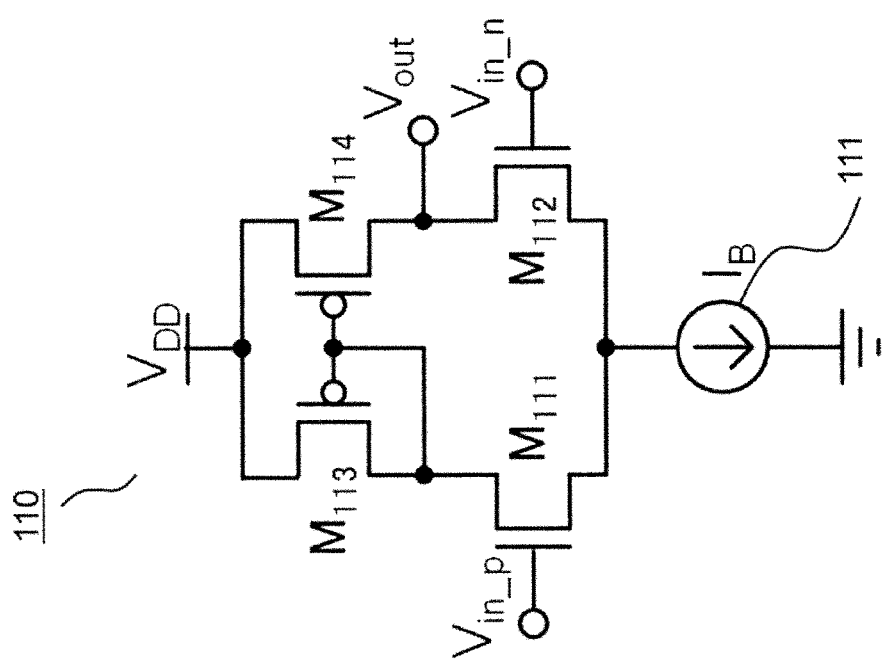
FIG. 11 is a circuit diagram of a conventional amplifier.
Figure 12:
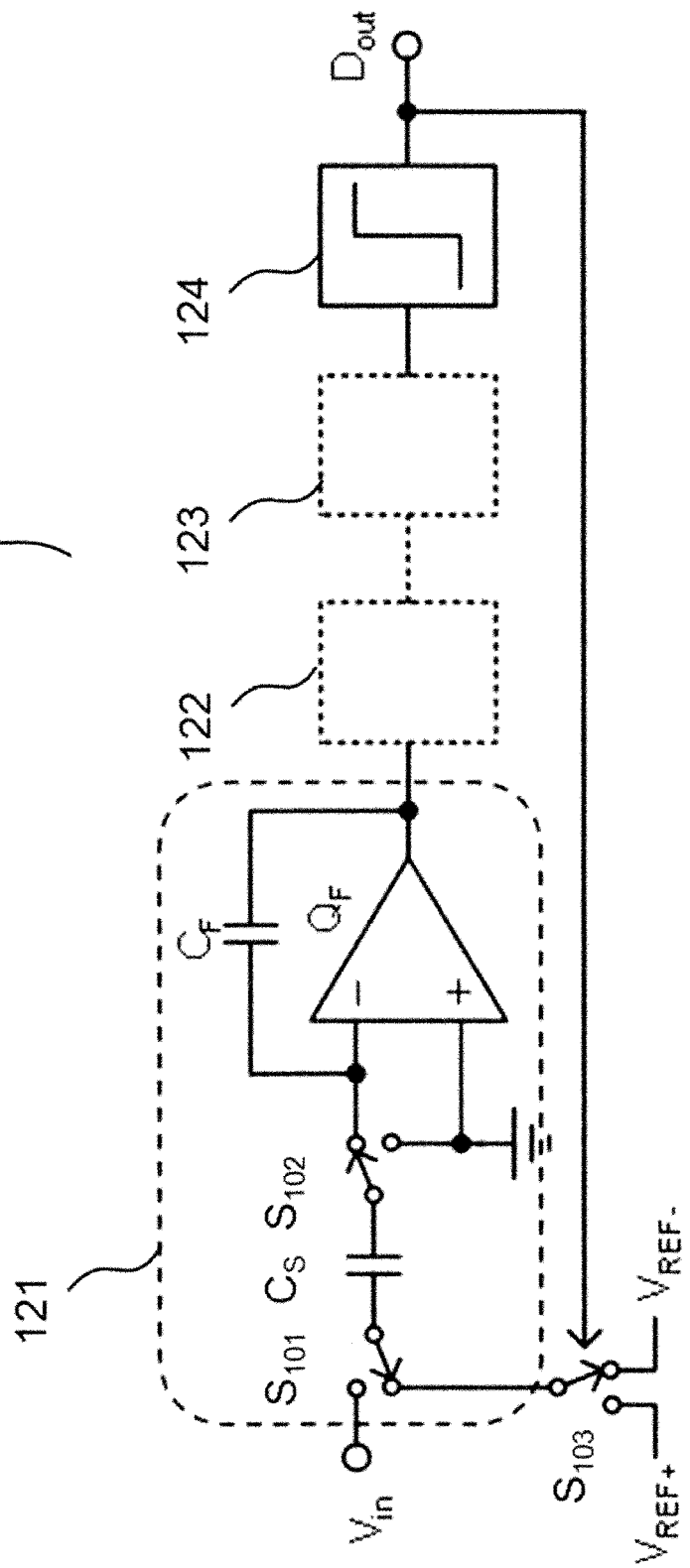
FIG. 12 is a circuit diagram of a conventional delta sigma A/D converter.

FIG. 9 shows conversion operation of the composite A/D converter. In successive approximation operation, a conversion value is determined while a reference voltage is sequentially set from an MSB side via a binary search. In this example, four bits are assumed for conversion of the SAR ADC. In this example, the input voltage is converted to a digital value of "1011". Conversion onward is switched to delta sigma A/D conversion by the delta sigma A/D converter 41. An input voltage range in SAR is indicated as a gray region. In the delta sigma A/D converter, a conversion range preferably includes this input voltage range with some overlap. Therefore, after conversion by SAR, the voltage is shifted from LSB voltage of SAR by 1/2 of LSB, and the conversion range is required to be widened by approximately one bit. Therefore, the control circuit of FIG. 8 is configured to control the circuit in this manner.

The delta sigma A/D converter 41 is required to take a high oversampling ratio M, which is a ratio of a frequency of 1/2 of the conversion frequency and a signal band. This means that the input signal becomes less prone to change greatly for each conversion. Therefore, unlike normal conversion of the SAR A/D converter, sequential conversion from MSB to LSB after signal sampling is not required, and an upper bit is set so as to correspond to the change range of the input signal and the remaining bits are converted. This control by the control circuit 43 can shorten a conversion cycle, allowing not only a faster A/D conversion speed but also a reduction of wasteful logic-circuit operation and resulting in low power consumption. Alternatively, with the same power consumption, effective conversion frequency can be increased, thereby allowing an increase of the oversampling ratio M. As a result, an improvement in SNR can also be achieved. The comparator 42 in the A/D converter in a composite structure shown in FIG. 8 may be a dynamic comparator without constant current flow. Alternatively, the comparator 42 may include a function of adjusting offset voltage.

INDUSTRIAL APPLICABILITY

The present invention can be used for low-power-consumption power sensor and, in particular, usable for reducing power of a sensor for IoT (Internet Of Things).

The invention claimed is:

1. An integrator comprising:
a first switch, one terminal of which is connected to an input terminal;
a first capacitor connected between a reference voltage terminal and another terminal of the first switch;
a second switch connected between an output terminal and the other terminal of the first switch;
a second capacitor connected between the reference voltage terminal and the output terminal;
an amplifier having an input connected to the output terminal and an output, the amplifier amplifying a voltage at the output terminal;
a third switch one terminal of which is connected to the output of the amplifier;
a forth switch connected between the output terminal and another terminal of the third switch;
a third capacitor connected between the reference voltage terminal and the other terminal of the third switch; and
a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

2. The integrator according to claim 1, wherein a first capacitance C1 of the first capacitor, a third capacitance C3 of the third capacitor, and a gain A of the amplifier satisfy the following equation:

$$C1=(A-1)\cdot C3.$$

3. The integrator according to claim 1, wherein the amplifier is a dynamic type amplifier.

4. The integrator according to claim 3, wherein the amplifier comprises:
a first and a second output capacitors;
a pre-charge circuit connected to the first and the second output capacitors, the pre-charge circuit pre-charging the first and the second output capacitors; and
a discharge circuit connected to the first and the second output capacitors, the discharge circuit selectively discharging one of the first and the second output capacitors in response to a voltage applied to the input of the amplifier.

5. The integrator according to claim 4, wherein the amplifier further comprises:
plural pears of transistors with different gate-width/gate-length ratios, each of the plural pears of transistors being supplied with a plurality of input signal pairs.

6. A delta sigma A/D converter comprising a plurality of integrators connected in series, each of the plurality of integrators comprising:
a first switch, one terminal of which is connected to an input terminal;
a first capacitor connected between a reference voltage terminal and another terminal of the first switch;
a second switch connected between an output terminal and the other terminal of the first switch;
a second capacitor connected between the reference voltage terminal and the output terminal;
an amplifier having an input connected to the output terminal and an output, the amplifier amplifying a voltage at the output terminal;
a third switch one terminal of which is connected to the output of the amplifier;
a forth switch connected between the output terminal and another terminal of the third switch;
a third capacitor connected between the reference voltage terminal and the other terminal of the third switch; and
a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

7. The delta sigma A/D converter according to claim 6, further comprising:
plurality of adders, each of the plurality of adders connected to an output of the corresponding one of the plurality of integrators, respectively; and
plurality of feed forward paths, each of the plurality of feed forward paths feeding an input signal supplied to a corresponding one of the plurality of integrators to a corresponding one of the adders, respectively.

8. The delta sigma A/D converter according to claim 6, wherein a first capacitance C1 of the first capacitor, a third capacitance C3 of the third capacitor, and a gain A of the amplifier satisfy the following equation:

$$C1=(A-1)\cdot C3.$$

9. The delta sigma A/D converter according to claim 6, wherein the amplifier is a dynamic type amplifier.

10. The delta sigma A/D converter according to claim 9, wherein the amplifier comprises:
a first and a second output capacitors;
a pre-charge circuit connected to the first and the second output capacitors, the pre-charge circuit pre-charging the first and the second output capacitors; and a discharge circuit connected to the first and the second output capacitors, the discharge circuit selectively discharging one of the first and the second output capacitors in response to a voltage applied to the input of the amplifier.

11. The delta sigma A/D converter according to claim 10, wherein the amplifier further comprises:
plural pears of transistors with different gate-width/gate-length ratios, each of the plural pears of transistors being supplied with a plurality of input signals.

12. An A/D converter comprising:
a successive approximation A/D converter for generating an output voltage, and a delta sigma A/D converter connected to the successive approximation A/D converter, the delta sigma A/D converter receiving the output voltage of the successive approximation A/D converter;
wherein the delta sigma A/D converter comprises:
a plurality of integrators connected in series, each of the plurality of integrators comprising:
a first switch, one terminal of which is connected to an input terminal;
a first capacitor connected between a reference voltage terminal and another terminal of the first switch;
a second switch connected between an output terminal and the other terminal of the first switch;
a second capacitor connected between the reference voltage terminal and the output terminal;
an amplifier having an input connected to the output terminal and an output, the amplifier amplifying a voltage at the output terminal;
a third switch one terminal of which is connected to the output of the amplifier;
a forth switch connected between the output terminal and another terminal of the third switch;
a third capacitor connected between the reference voltage terminal and the other terminal of the third switch; and
a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

13. The A/D converter according to claim 12, further comprising a voltage shift circuit connected to the successive approximation A/D converter and the delta sigma A/D converter, the voltage shift circuit shifting the output voltage of the successive approximation A/D converter with a predetermined voltage, and for supplying a sifted voltage to the delta sigma A/D converter.

14. The A/D converter according to claim 12, wherein
the successive approximation A/D converter performs a binary search in a limited input voltage range.

15. The A/D converter according to claim 12, wherein a first capacitance C1 of the first capacitor, a third capacitance C3 of the third capacitor, and a gain A of the amplifier satisfy the following equation:

$$C1 = (A-1) \cdot C3.$$

16. The A/D converter according to claim 12, wherein the amplifier is a dynamic type amplifier.

17. The A/D converter according to claim 12, wherein the amplifier comprises:
a first and a second output capacitors;
a pre-charge circuit connected to the first and the second output capacitors, the pre-charge circuit pre-charging the first and the second output capacitors; and
a discharge circuit connected to the first and the second output capacitors, the discharge circuit selectively discharging one of the first and the second output capacitors in response to a voltage applied to the input of the amplifier.

18. The A/D converter according to claim 17, wherein the amplifier further comprises:
plural pears of transistors with different gate-width/gate-length ratios, each of the plural pears of transistors being supplied with a plurality of input signals.

* * * * *